United States Patent
Ugajin et al.

(10) Patent No.: US 6,549,074 B2
(45) Date of Patent: Apr. 15, 2003

(54) TRANSCONDUCTANCE AMPLIFIER, FILTER USING THE TRANSCONDUCTANCE AMPLIFIER AND TUNING CIRCUITRY FOR TRANSCONDUCTANCE AMPLIFIER IN THE FILTER

(75) Inventors: Mamoru Ugajin, Kanagawa (JP); Tsuneo Tsukahara, Kanagawa (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 19 days.

(21) Appl. No.: 09/998,645

(22) Filed: Dec. 3, 2001

(65) Prior Publication Data

US 2002/0067208 A1 Jun. 6, 2002

(30) Foreign Application Priority Data

Dec. 5, 2000 (JP) ........................................ 2000-369527

(51) Int. Cl.[7] ................................................ H03F 3/45
(52) U.S. Cl. ...................... 330/258; 330/253; 330/259
(58) Field of Search ................................ 330/253, 257, 330/258, 259, 260

(56) References Cited

U.S. PATENT DOCUMENTS

| | | | | | |
|---|---|---|---|---|---|
| 4,110,641 | A | * | 8/1978 | Payne | 307/355 |
| 5,442,318 | A | * | 8/1995 | Badyal et al. | 330/253 |
| 5,789,981 | A | * | 8/1998 | Singer et al. | 330/253 |
| 6,265,941 | B1 | * | 7/2001 | Lopata | 330/258 |
| 6,380,806 | B1 | * | 4/2002 | Ang | 330/258 |

* cited by examiner

*Primary Examiner*—Henry Choe
(74) *Attorney, Agent, or Firm*—Armstrong, Westerman & Hattori, LLP.

(57) ABSTRACT

An input stage for adjusting the gain or conductance Gm depending upon a control voltage applied and an output stage for securing a sufficiently high output impedance and a sufficiently wide output dynamic range are connected between the voltage source and the ground in parallel with each other.

29 Claims, 8 Drawing Sheets

Fig. 8

TRANSCONDUCTANCE AMPLIFIER, FILTER USING THE TRANSCONDUCTANCE AMPLIFIER AND TUNING CIRCUITRY FOR TRANSCONDUCTANCE AMPLIFIER IN THE FILTER

FIELD OF THE INVENTION

The present invention relates to a transconductance amplifier suitable for a low-power LSI used in a portable radio equipment, to a filter formed in the LSI with using the transconductance amplifier, and to a transconductance amplifier tuning circuitry used for tuning a gain of the transconductance amplifier in the filter.

DESCRIPTION OF THE RELATED ART

In connection with recent wide spread of portable radio equipments, these equipments have been required to be smaller in size and lower in manufacturing cost. In order to satisfy these requirements, important is to reduce the mounting area and also the mounting cost of LSI on the portable radio equipment by using an on-chip filter in stead of a conventional filter with an outboard element. Such on-chip filter might be formed by combining transconductance amplifiers and capacitors.

A conventional transconductance amplifier used for the on-chip filter is configured by a series circuitry, connected between the voltage source and the ground, of a differential input circuit consisting of a pair of transistors for voltage-current conversion of input voltage, a drain voltage adjustment circuit for fixing the drain voltage of the pair of the transistors to a control voltage (voltage for determining the conductance Gm) applied to its control terminal, a current mirror circuit and an output stage.

According to the conventional transconductance amplifier, required is 0.2–0.3 V of the source-drain voltage of the transistors of the differential input circuit to operate these transistors at its linear response region. Also, 0.2–0.3 V is required as for a range of the control voltage of the conductance Gm and furthermore 0.5–0.6 V of the source-drain voltage of an output transistor in the current mirror circuit is required to saturate the output transistor so as to sufficiently increase the output impedance. Therefore, in order to secure an output dynamic range of 0.4–0.5 V or more, it is necessary to keep the source voltage VDD at 1.5 V or more.

SUMMARY OF THE INVENTION

It is therefore an object of the present invention to provide a transconductance amplifier which can be operated at a lower source voltage such as 1 V or less for example with keeping a sufficiently high output impedance and a sufficiently wide output dynamic range, to provide a filter using the transconductance amplifier and to provide a transconductance amplifier tuning circuitry for tuning a gain of the transconductance amplifier in the filter.

Another object of the present invention is to provide a small power transconductance amplifier tuning circuitry using the transconductance amplifier.

According to the present invention, a transconductance amplifier has an input stage and an output stage. The input stage includes a differential input circuit for converting a differential voltage signal applied thereto into a differential current signal, a first pair of regulated cascode circuits for adjusting output voltages of the differential input circuit depending upon a control voltage applied thereto, and an input section of a pair of current mirror circuits for mirroring the differential current signal from the differential input circuit. The differential input circuit, the first pair of regulated cascode circuits, and the input section of the pair of current mirror circuits are connected in series with each other between a voltage source and a ground. The output stage includes an output section of the pair of current mirror circuits, a differential current source circuit, a second pair of regulated cascode circuits for keeping output voltages of the current mirror circuit to a first bias voltage applied thereto, a third pair of regulated cascode circuits for keeping output voltages of the differential current source circuit to a second bias voltage applied thereto, output terminals of the third pair of regulated cascode circuits being connected to output terminals of the second pair of regulated cascode circuits, and a pair of amplifier output terminals connected to the output terminals of the second and third pairs of regulated cascode circuits. The output section of the pair of current mirror circuits, the second and third pairs of regulated cascode circuits and the differential current source circuit are connected in series with each other between the voltage source and the ground.

The input stage for adjusting the gain or conductance Gm depending upon the control voltage applied and the output stage for securing a sufficiently high output impedance and a sufficiently wide output dynamic range are connected between the voltage source and the ground in parallel with each other. Thus, the gain can be adjusted over a wider range even if the source voltage is lower than the conventional one, for example at 1 V or less. Also, a sufficiently high output impedance and a sufficiently wide output dynamic range can be expected at the lower source voltage.

It is preferred that the transconductance amplifier further includes a feedback circuit for common-mode noise suppression. This feedback circuit controls, depending upon common-mode noise applied to the transconductance amplifier, output voltages at the pair of amplifier output terminals to a predetermined voltage.

In this case, it is more preferred that the differential current source circuit controls currents flowing through the second and third pairs of regulated cascode circuits depending upon a feedback signal provided from the feedback circuit.

It is also preferred that the differential input circuit consists of two enhancement MOS transistors with a low threshold voltage, for receiving the differential voltage signal applied thereto, respectively. In this case, more preferably, the low threshold voltage of the enhancement MOS transistors is less than 0.2 V. As a consequence of this configuration, the source voltage can be more lowered.

It is preferred that the differential input circuit consists of two depletion MOS transistors for receiving the differential voltage signal applied thereto, respectively. As a consequence of this configuration, the source voltage can be further lowered.

It is also preferred that the differential input circuit consists of first and second transistors with gates connected respectively to first and second amplifier input terminals and with sources connected together to the ground or the voltage source.

It is preferred that each pair of the first, second and third pairs of regulated cascode circuit consists of an operational amplifier and a transistor with a gate connected to an output terminal of the operational amplifier.

It is also preferred that the first pair of regulated cascode circuits consist of third and fourth transistors with sources connected respectively to output terminals of the differential input circuit, a first operational amplifier with a non-inverting input terminal connected to a control terminal which receives the control voltage for controlling a conductance Gm, with an inverting input terminal connected to a source of the third transistor and with an output terminal connected to a gate of the third transistor, and a second operational amplifier with a non-inverting input terminal connected to the control terminal, with an inverting input terminal connected to a source of the fourth transistor and with an output terminal connected to a gate of the fourth transistor.

It is further preferred that the second pair of regulated cascode circuits consist of ninth and tenth transistors with sources connected respectively to output terminals of the current mirror circuit, a third operational amplifier with a non-inverting input terminal connected to a first bias terminal, with an inverting input terminal connected to a source of the ninth transistor and with an output terminal connected to a gate of the ninth transistor, and a fourth operational amplifier with a non-inverting input terminal connected to the first bias terminal, with an inverting input terminal connected to a source of the tenth transistor and with an output terminal connected to a gate of the tenth transistor.

It is also preferred that the third pair of regulated cascode circuits consist of thirteenth and fourteenth transistors with sources connected respectively to output terminals of the differential current source circuit, a fifth operational amplifier with a non-inverting input terminal connected to a second bias terminal, with an inverting input terminal connected to a source of the thirteenth transistor and with an output terminal connected to a gate of the thirteenth transistor, and a sixth operational amplifier with a non-inverting input terminal connected to the second bias terminal, with an inverting input terminal connected to a source of the fourteenth transistor and with an output terminal connected to a gate of the fourteenth transistor.

It is preferred that the first bias voltage (Vb1) is set to a voltage of about ¾ of a source voltage or more and the second bias voltage (Vb2) is set to a voltage of about ¼ of the source voltage or less, or that the first bias voltage (Vb1') is set to a voltage of about ¼ of the source voltage or less and the second bias voltage (Vb2') is set to a voltage of about ¾ of a source voltage or more. Thus, a sufficient output dynamic range can be secured.

According to the present invention, also, a filter is provided with a plurality of transconductance amplifiers each having the aforementioned configuration.

According to the present invention, further, a transconductance amplifier tuning circuitry includes two reference signal input terminals to which reference frequency signals are input, an RC phase-shifter connected to the two reference signal input terminals and provided with two transconductance amplifiers each having the aforementioned configuration and two capacitors, a multiplier with input terminals connected to two output terminals of the RC phase-shifter and to the two reference signal input terminals, and an operational amplifier with two differential input terminals connected to two output terminals of the multiplier and with an output terminal connected to control terminals of the transconductance amplifiers. The tuning circuitry feedback-controls gains of the two transconductance amplifiers so that the RC phase-shifter always shifts a phase of the input reference frequency signals by 90 degrees.

In the conventional transconductance amplifier tuning circuitry input reference frequency signals are applied to a RC low pass filter and a CR high pass filter configured by four transconductance amplifiers and capacitors, and the gains of these transconductance amplifiers are feedback controlled so that output signal amplitudes of these filters become equal to each other. Thus, required is four transconductance amplifiers causing large power consumption and increased occupying area in a LSI chip.

Whereas, since the tuning circuitry according to the present invention is configured by the RC phase-shifter for shifting the input reference frequency signal phase by 90 degrees, the multiplier and the operational amplifier, required is only two transconductance amplifiers and two capacitors resulting smaller power consumption and smaller occupying area in a LSI chip.

It is preferred that the RC phase-shifter includes a first transconductance amplifier with first and second input terminals connected to the two reference signal input terminals, a first capacitor connected between the first input terminal of the first transconductance amplifier and a first output terminal of the first transconductance amplifier, a second capacitor connected between the second input terminal of the first transconductance amplifier and a second output terminal of the first transconductance amplifier, and a second transconductance amplifier with a first output terminal connected to the second output terminal of the first transconductance amplifier and with a second output terminal connected to the first output terminal of the first transconductance amplifier. A first input terminal of the second transconductance amplifier is connected to the first output terminal of the second transconductance amplifier and a second input terminal of the second transconductance amplifier is connected to the second output terminal of the second transconductance amplifier.

It is also preferred that the multiplier is a mixer circuit with first two input terminals connected to the two reference signal input terminals and with second two input terminals connected to the first and second output terminals of the first transconductance amplifier.

It is preferred that the circuitry further includes a control signal output terminal connected to the output terminal of the operational amplifier, for outputting the control signal outside.

It is also preferred that the circuitry further includes a third capacitor for smoothing, connected between the control signal output terminal and the ground.

According to the present invention, a transconductance amplifier includes first and second transistors with gates connected respectively to first and second amplifier input terminals to which a differential voltage is input and with sources connected together to a first voltage source, third and fourth transistors with sources connected respectively to drains of the first and second transistors, a first operational amplifier with a non-inverting input terminal connected to a control terminal which receives a signal for controlling a conductance Gm, with an inverting input terminal connected to a source of the third transistor and with an output terminal connected to a gate of the third transistor, a second operational amplifier with a non-inverting input terminal connected to the control terminal, with an inverting input terminal connected to a source of the fourth transistor and with an output terminal connected to a gate of the fourth transistor, fifth and sixth transistors with sources connected together to a second voltage source and with drains and gates connected respectively to drains of the third and fourth transistors, seventh and eighth transistors with sources connected together to the second voltage source and with gates connected respectively to the drains and gates of the fifth and sixth transistors, ninth and tenth transistors with sources connected respectively to drains of the seventh and eighth transistors, a third operational amplifier with a non-inverting input terminal connected to a first bias terminal, with an inverting input terminal connected to a source of the ninth transistor and with an output terminal connected to a gate of the ninth transistor, a fourth operational amplifier with a non-inverting input terminal connected to the first bias terminal, with an inverting input terminal connected to a source of the tenth transistor and with an output terminal connected to a gate of the tenth transistor, eleventh and twelfth transistors with sources connected together to the first voltage source, thirteenth and fourteenth transistors with drains connected respectively to drains of the ninth and tenth transistors and with sources connected respectively to drains of the eleventh and twelfth transistors, a fifth operational amplifier with a non-inverting input terminal connected to a second bias terminal, with an inverting input terminal connected to a source of the thirteenth transistor and with an output terminal connected to a gate of the thirteenth transistor, a sixth operational amplifier with a non-inverting input terminal connected to the second bias terminal, with an inverting input terminal connected to a source of the fourteenth transistor and with an output terminal connected to a gate of the fourteenth transistor, and first and second amplifier output terminals connected to the drains of the ninth and thirteenth transistors and the drains of the tenth and fourteenth transistors, respectively.

The input stage for adjusting the gain or conductance Gm depending upon the control voltage applied (first to sixth transistors and first and second operational amplifiers) and the output stage for securing a sufficiently high output impedance and a sufficiently wide output dynamic range (seventh to fourteenth transistors and third and fourth operational amplifiers) are connected between the first and second voltage sources in parallel with each other. Thus, the gain can be adjusted over a wider range even if the source voltage is lower than the conventional one, for example at 1 V or less. Also, a sufficiently high output impedance and a sufficiently wide output dynamic range can be expected at the lower source voltage.

It is preferred that the transconductance amplifier further includes a feedback circuit for common-mode noise suppression. This feedback circuit has input terminals connected to the drains of the fifth and sixth transistors and to the first and second amplifier output terminals, and an output terminal connected to gates of the eleventh and twelfth transistors for providing a common-mode noise canceling signal when signals at its input terminals change due to a common-mode noise occurrence.

In this case, it is also preferred that the feedback circuit has fifteenth and sixteenth transistors with gates connected together to the drain and gate of the sixth transistor and with sources connected together to the second voltage source, seventeenth and eighteenth transistors with gates connected together to the drain and gate of the fifth transistor and with sources connected together to the second voltage source, a nineteenth transistor with a gate connected to the first amplifier output terminal and with a source connected together to drains of the fifteenth and seventeenth transistors, a twentieth transistor with a gate connected to the second amplifier output terminal and with a source connected together to drains of the sixteenth and eighteenth transistors, a twenty-first transistor with a gate connected to a third bias terminal and with a source connected together to the drains of the fifteenth and seventeenth transistors, a twenty-second transistor with a gate connected to the third bias terminal and with a source connected together to the drains of the sixteenth and eighteenth transistors, a twenty-third transistor with a source connected to the first voltage source and with gate and drain connected together to drains of the nineteenth and twentieth transistors, and a twenty-fourth transistor with a source connected to the first voltage source and with gate and drain connected together to drains of the twenty-first and twenty-second transistors and to gates of the eleventh and twelfth transistors.

It is further preferred that the first voltage source is a ground and the second voltage source is a positive voltage source, wherein the first, second, third, fourth, eleventh, twelfth, thirteenth and fourteenth transistors are NMOS transistors, and wherein the fifth, sixth, seventh, eighth, ninth and tenth transistors are PMOS transistors, or that the first voltage source is a positive voltage source and the second voltage source is a ground, wherein the first, second, third, fourth, eleventh, twelfth, thirteenth and fourteenth transistors are PMOS transistors, and wherein the fifth, sixth, seventh, eighth, ninth and tenth transistors are NMOS transistors.

It is preferred that the first and second transistors are enhancement MOS transistors with an absolute threshold voltage less than 0.2 V, or that the first and second transistors are depletion MOS transistors. As a consequence of this configuration, the source voltage can be more lowered.

According to the present invention, a filter is provided with a plurality of transconductance amplifiers each having the aforementioned configuration.

Furthermore, according to the present invention, a transconductance amplifier tuning circuitry includes first and second reference signal input terminals for receiving reference frequency signals, a control signal output terminal for outputting a control signal, first and second transconductance amplifiers each having the aforementioned configuration, first and second capacitors, a mixer circuit and an operational amplifier. The first and second reference signal input terminals are connected to first and second input terminals of the first transconductance amplifier. The first input terminal of the first transconductance amplifier and a first output terminal of the first transconductance amplifier are connected via the first capacitor, the second input terminal of the first transconductance amplifier and a second output terminal of the first transconductance amplifier being connected via the second capacitor. The second output terminal of the first transconductance amplifier is connected to a first output terminal of the second transconductance amplifier, and the first output terminal of the first transconductance amplifier is connected to a second output terminal of the second transconductance amplifier. A first input terminal of the second transconductance amplifier is connected to the first output terminal of the second transconductance amplifier, and a second input terminal of the second transconductance amplifier is connected to the second output terminal of the second transconductance amplifier. First two input terminals of the mixer circuit are connected to the first and second reference signal input terminals, and second two input terminals of the mixer circuit are connected to the first and second output terminals of the first transconductance amplifier. Two output terminals of the mixer circuit are connected respectively to two differential input terminals of the operational amplifier. An output terminal of the operational amplifier is connected to control terminals of the first and second transconductance amplifiers and to the control signal output terminal. An RC phase-shifter is configured by the first and second transconductance amplifiers and the first and second capacitors, the mixer circuit and the operational amplifier to form a feedback loop for controlling gains of the first and second transconductance amplifiers so that the RC phase-shifter always shifts a phase of the input reference frequency signals by 90 degrees.

Since the tuning circuitry according to the present invention is configured by the RC phase-shifter for shifting the input reference frequency signal phase by 90 degrees, the mixer circuit and the operational amplifier, required is only two transconductance amplifiers and two capacitors resulting smaller power consumption and smaller occupying area in a LSI chip.

It is preferred that the circuitry further includes a third capacitor for smoothing, connected between the control signal output terminal and a ground.

Further objects and advantages of the present invention will be apparent from the following description of the preferred embodiments of the invention as illustrated in the accompanying drawings.

DESCRIPTION OF THE PREFERRED EMBODIMENTS

Figure 1:
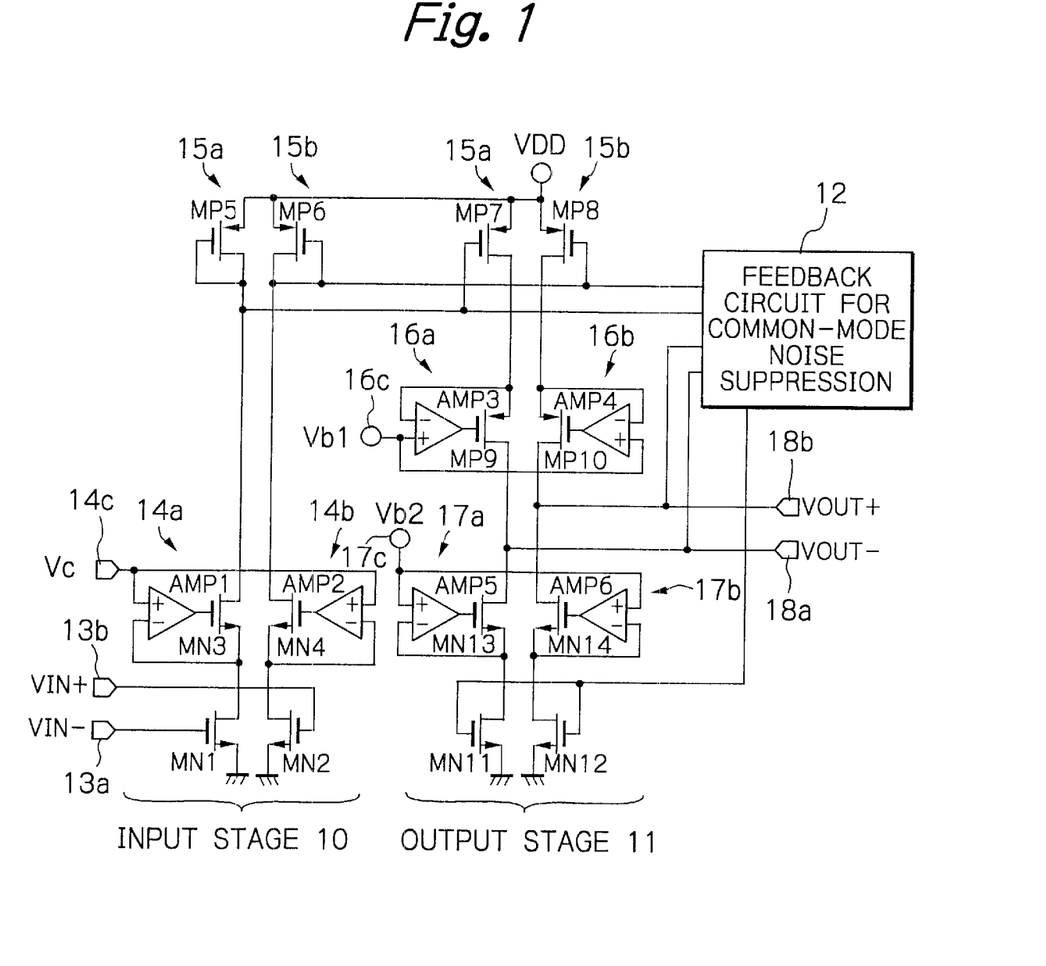
FIG. 1 shows a circuit diagram illustrating a transconductance amplifier in a first embodiment according to the present invention.
Figure 2:
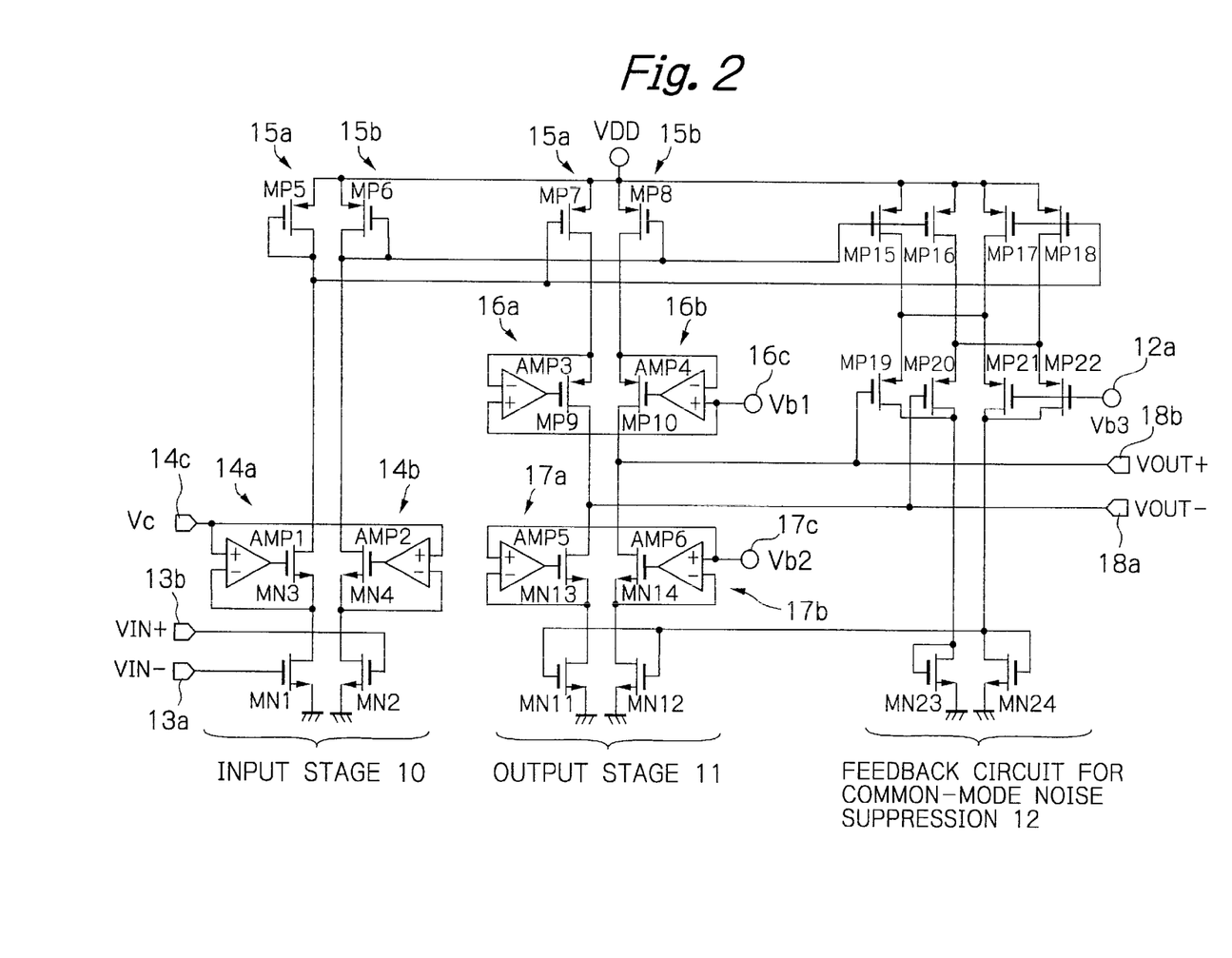
FIG. 2 shows a circuit diagram concretely illustrating a feedback circuit for common-mode noise suppression in the first embodiment of FIG. 1.

FIG. 1 illustrates a transconductance amplifier in a first embodiment according to the present invention, and FIG. 2 concretely illustrates a feedback circuit for common mode noise rejection in this first embodiment of FIG. 1.

In these figures, reference numeral 10 denotes an input stage, 11 an output stage and 12 a feedback circuit for common mode noise suppression, respectively. In this embodiment, the input stage 10 and the output stage 11 formed independently are connected between the voltage source and the ground in parallel with each other.

In the figures, furthermore, MNx (x is a natural number) denotes a NMOS transistor, MPx a PMOS transistor, AMPx an operational amplifier. Also, reference numeral 13a and 13b denote a pair of amplifier input terminals to which differential voltages VIN− and VIN+ are input respectively, 18a and 18b a pair of amplifier output terminals from which differential voltages VOUT− and VOUT+ are output respectively. Transistors in this embodiment are enhancement MOS transistors unless otherwise specified.

In the input stage 10, gates of a pair of transistors MN1 and MN2 that configure a differential input circuit are connected to the pair of amplifier input terminals 13a and 13b respectively, and sources of these transistors MN1 and MN2 are grounded together. Thus, differential voltages applied to the input terminals 13a and 13b are amplified and converted into differential currents by the transistors MN1 and MN2, respectively.

To drains of the transistors MN1 and MN2, a pair of drain voltage adjustment circuits 14a and 14b are connected, respectively. The adjustment circuits 14a and 14b are configured by an operational amplifier AMP1 and a transistor MN3 and an operational amplifier AMP2 and a transistor MN4, respectively.

In the drain voltage adjustment circuit 14a, a control terminal 14c which receives a control voltage Vc for controlling a gain or conductance Gm is connected to a non-inverting input terminal of the operational amplifier AMP1, a source of the transistor MN3 is connected to an inverting input terminal of the amplifier AMP1, and a gate of the transistor MN3 is connected to an output terminal of the amplifier AMP1. Also, in the drain voltage adjustment circuit 14b, the control terminal 14c is connected to a non-inverting input terminal of the operational amplifier AMP2, a source of the transistor MN4 is connected to an inverting input terminal of the amplifier AMP2, and a gate of the transistor MN4 is connected to an output terminal of the amplifier AMP2.

As will be noted, the drain voltage adjustment circuits 14a and 14b are configured by regulated cascode circuits and these circuits 14a and 14b control gate voltages of the transistors MN3 and MN4 so as to fix the drain voltage of the transistors MN1 and MN2 to the control voltage Vc for determining the conductance Gm, applied to the control terminal 14c, in other words so as to control their gain. Therefore, linear voltage-current conversions of the input differential voltages based upon the controlled gain are carried out in the transistors MN1 and MN2.

The converted differential currents are mirrored by transistors MP5 and MP7 that configure a current mirror circuit 15a and by transistors MP6 and MP8 that configure a current mirror circuit 15b and applied to the output stage 11.

In the pair of the current mirror circuits 15a and 15b, sources of the transistor MP5 and MP6 that configure input sections are connected together to the voltage source, and drains and gates of these transistors MP5 and MP6 are connected to the drains of the transistors MN3 and MN4, respectively. Sources of the transistors MP7 and MP8 that configure output sections of the current mirror circuits 15a and 15b are connected together to the voltage source, and gates of these transistors MP7 and MP8 are connected to the drains and gates of the transistors MP5 and MP6, respectively. Drains of the transistors MP7 and MP8 are connected to a pair of drain voltage fixing circuits 16a and 16b, respectively. The drain voltage fixing circuit 16a is configured by an operational amplifier AMP3 and a transistor MP9, and the drain voltage fixing circuit 16b is configured by an operational amplifier AMP4 and a transistor MP10.

In the drain voltage fixing circuit 16a, a bias terminal 16c which receives a constant bias voltage Vb1 is connected to a non-inverting input terminal of the operational amplifier AMP3, a source of the transistor MP9 is connected to an inverting input terminal of the amplifier AMP3, and a gate of the transistor MP9 is connected to an output of the amplifier AMP3. Also, in the drain voltage fixing circuit 16b, the bias terminal 16c is connected to a non-inverting input terminal of the operational amplifier AMP4, a source of the transistor MP10 is connected to an inverting input terminal of the amplifier AMP4, and a gate of the transistor MP10 is connected to an output of the amplifier AMP4.

The drain voltage fixing circuits 16a and 16b are configured by regulated cascode circuits and control gate voltages of the transistors MP9 and MP10 so as to fix the drain voltage of the transistors MP7 and MP8 to the constant bias voltage Vb1 applied to the bias terminal 16c. The bias voltage Vb1 is determined to a value of about ¾ of the source voltage VDD or more. More concretely, in case that the source voltage VDD is 1 V, the bias voltage Vb1 may be set to about 0.75 V, more preferably to about 0.85 V.

Drains of the transistors MP9 and MP10, which are output terminals of the drain voltage fixing circuits 16a and 16b, are connected to drains of transistors MN13 and MN14, which are output terminals of a pair of drain voltage fixing circuits 17a and 17b, respectively. These drains of the transistors MP9 and MP10 and of the transistors MN13 and MN14 are connected to the amplifier output terminals 18a and 18b, respectively.

In the drain voltage fixing circuit 17a, a bias terminal 17c which receives a constant bias voltage Vb2 is connected to a non-inverting input terminal of the operational amplifier AMP5, a source of the transistor MN13 is connected to an inverting input terminal of the amplifier AMP5, and a gate of the transistor MN13 is connected to an output of the amplifier AMP5. Also, in the drain voltage fixing circuit 17b, the bias terminal 17c is connected to a non-inverting input terminal of the operational amplifier AMP6, a source of the transistor MN14 is connected to an inverting input terminal of the amplifier AMP6, and a gate of the transistor MN14 is connected to an output of the amplifier AMP6. Drains of a pair of transistors MN11 and MN12 that configure a differential current source circuit for controlling current flowing through the drain voltage fixing circuits 16a, 16b, 17a and 17b are connected to sources of the transistors MN13 and MN14 of the fixing circuits 17a and 17b, respectively.

The drain voltage fixing circuits 17a and 17b are configured by regulated cascode circuits and control gate voltages of the transistors MN13 and MN14 so as to fix the drain voltage of the transistors MN11 and MN12 to the constant bias voltage Vb2 applied to the bias terminal 17c. The bias voltage Vb2 is determined to a value of about ¼ of the source voltage VDD or less. More concretely, in case that the source voltage VDD is 1 V, the bias voltage Vb2 may be set to about 0.25 V, more preferably to about 0.15 V.

Sources of the transistors MN11 and MN12 that configure the differential current source circuit are grounded, and gates of these transistors are connected together to an output terminal of the feedback circuit 12.

As will be noted from the above-description, according to this embodiment, the input and output stages 10 and 11 mirrored by the current mirror circuits are connected between the voltage source and the ground in parallel with each other. In the input stage 10, the drain voltage adjustment circuits 14a and 14b each consisting of a regulated cascode circuit are provided so as to adjust the gain or conductance Gm depending upon the applied control voltage. On the other hand, in the output stage 11, the drain voltage fixing circuits 16a and 16b each consisting of a regulated cascode circuit and the drain voltage fixing circuits 17a and 17b each consisting of a regulated cascode circuit are provided at both sides near the voltage source and near the ground, and the amplifier output terminals 18a and 18b are provided between the circuits 16a and 17a and the circuits 16b and 17b so that a sufficiently high output impedance and a sufficiently wide output dynamic range can be obtained even if the source voltage is low. Since the drain voltage is fixed by the regulated cascode circuit, the output impedance will be insensitive to the load and therefore a high output impedance can be expected. Also, since the drain voltages are fixed to 0.75 V and 0.25 V, in case of the source voltage of 1 V, by the regulated cascode circuits connected in series between the voltage source and the ground, a sufficient dynamic range of about 0.4 V can be expected at each amplifier output terminal. If the bias voltages Vb1 and Vb2 are set to about 0.85 V and about 0.15 V, the dynamic range will be further widened.

As mentioned above, according to this embodiment, the gain can be adjusted over a wider range even if the source voltage is lower than the conventional one, for example at 1 V or less. Also, a sufficiently high output impedance and a sufficiently wide output dynamic range can be expected at the lower source voltage.

In this embodiment, the pair of the transistors MN1 and MN2 that configure the differential input circuit are enhancement NMOS transistors. The threshold voltage Vth thereof is preferably set to a value lower than 0.2 V. In general, a DC voltage level of input/output signal is determined to a half of the source voltage (VDD/2). Therefore, suppose a dynamic range of input voltage signal is ±0.3 V, the threshold voltage Vth of a transistor in input circuit should be Vth<VDD/2−0.3 V in order to achieve linear voltage-current conversion. Thus, to realize the source voltage of VDD=1 V, it is necessary to use an enhancement transistor with a threshold voltage Vth less than 0.2 V.

Since the transconductance amplifier in this embodiment is differential type, the feedback circuit 12 for common-mode noise suppression is provided. Hereinafter, configuration of this feedback circuit 12 will be described in detail with reference to FIG. 2.

The feedback circuit 12 for common-mode noise suppression receives, as input signals, drain voltages of the transistors MP5 and MP6 and output voltages at the amplifier output terminals 18a and 18b, and produces an output signal for controlling gate voltage of the transistors MN11 and MN12 that configure the differential current source circuit. More concretely, this feedback circuit 12 consists of PMOS transistors MP15–MP22 and NMOS transistors MN23 and MN24, and controls drain currents of the transistors MN11 and MN12 so that DC voltage levels at the amplifier output terminals 18a and 18b become equal to a bias voltage Vb3 applied to a bias terminal 12a even when common-mode noise enters.

Gates of the transistors MP15 and MP16 are connected together to the drain and gate of the transistor MP6 and sources of the transistors MP15 and MP16 are connected together to the voltage source. Gates of the transistors MP17 and MP18 are connected together to the drain and gate of the transistor MP5 and sources of the transistors MP17 and MP18 are connected together to the voltage source. A gate of the transistor MP19 is connected to the amplifier output terminal 18b and a source of this transistor MP19 is connected together to drains of the transistors MP15 and MP17. A gate of the transistor MP20 is connected to the amplifier output terminal 18a and a source of this transistor MP20 is connected together to drains of the transistors MP16 and MP18. A gate of the transistor MP21 is connected to the bias terminal 12a and a source of this transistor MP21 is connected together to the drains of the transistors MP15 and MP17. A gate of the transistor MP22 is connected to the bias terminal 12a and a source of this transistor MP22 is connected together to drains of the transistors MP16 and MP18. A source of the transistor MN23 is grounded and gate and drain of this transistor MN23 are connected together to drains of the transistors MP19 and MP20. A source of the transistor MN24 is grounded and gate and drain of this transistor MN24 are connected together to drains of the transistors MP21 and MP22.

In case that the drain voltages of the transistors MP5 and MP6 increase due to the common-mode noise, the drain current of the transistors MP7 and MP8 decrease and therefore both the output voltages at the amplifier output terminals 18a and 18b decrease if no feedback control is executed. However, in this case, since the drain currents of the transistors MP15–MP18 in the feedback circuit 12 decrease and also the drain currents of the transistors MP19 and MP20 increase, the drain currents of the transistors MP21 and MP22 decrease. Thus, the drain currents of the transistors MN11 and MN12 decrease so as to increase the DC voltages at the amplifier output terminals 18a and 18b to be equal to the bias voltage Vb3. In case that the drain voltages of the transistors MP5 and MP6 decrease due to the common-mode noise, the reverse of the aforementioned operations will be executed.

In this embodiment, enhancement MOS transistors are used for the transistors MN3, MN4, MN9, MN10, MN13 and MN14 whose gates are connected to the output terminals of the operational amplifiers AMP1–AMP6, respectively. However, depletion MOS transistors may be used for these transistors MN3, MN4, MN9, MN10, MN13 and MN14.

The configurations of the drain voltage adjustment circuits 14a and 14b, the drain voltage fixing circuits 16a and 16b and the drain voltage fixing circuits 17a and 17b are not limited to the aforementioned configurations but various modifications may be possible. Also, the configurations of the current mirror circuits 15a and 15b and the feed back circuit 12 are not limited to the aforementioned configurations but various modifications may be possible.

Figure 3:
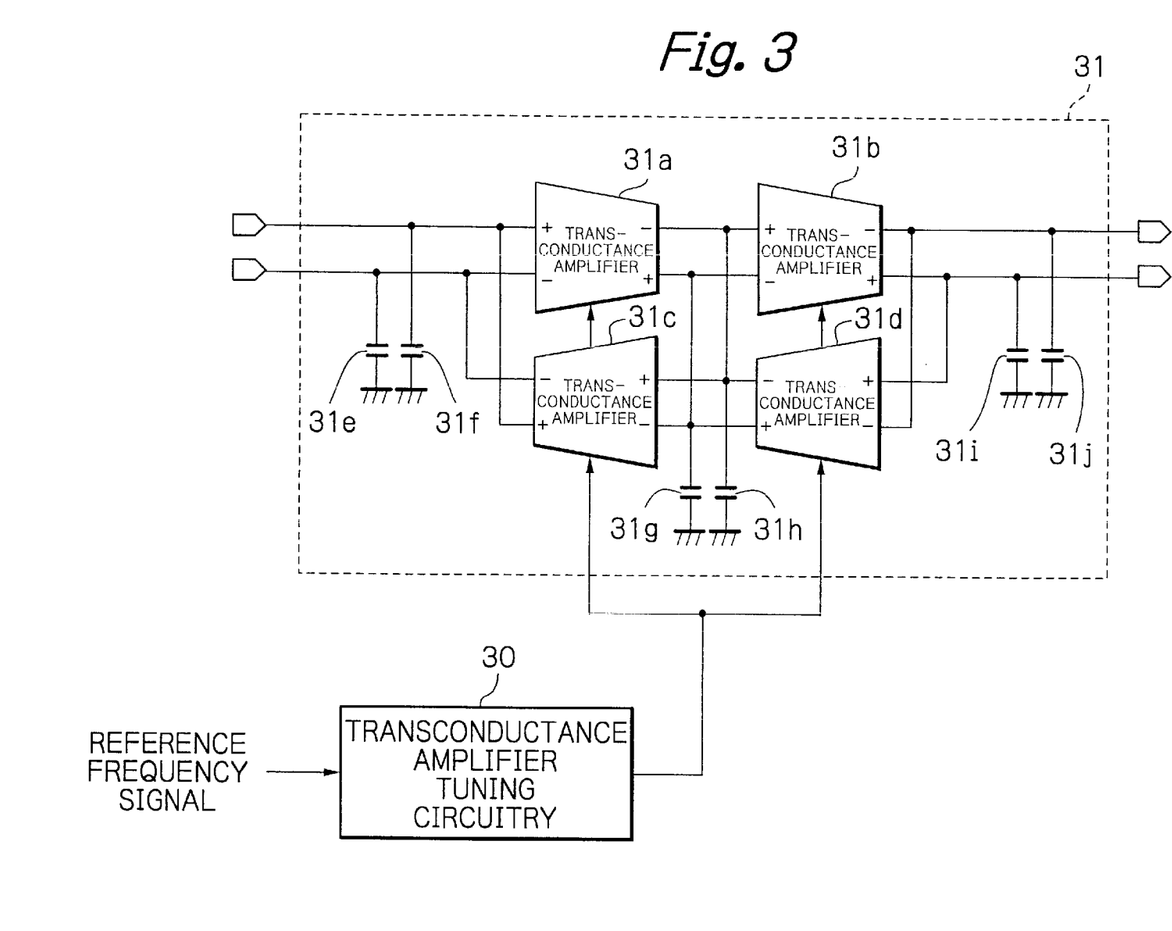
FIG. 3 shows a block diagram schematically illustrating an example of a filter and a transconductance amplifier tuning circuitry actually using the transconductance amplifiers in the first embodiment of FIG. 1.

FIG. 3 schematically illustrates an example of a filter and a transconductance amplifier tuning circuitry actually using the transconductance amplifiers in this embodiment.

In the figure, reference numeral 30 denotes the transconductance amplifier tuning circuitry using two transconductance amplifiers each having the aforementioned configuration, and 31 the filter (Gm-C filter) using transconductance amplifiers each having the aforementioned configuration and capacitors.

In this example, the Gm-C filter 31 consists of four transconductance amplifiers 31a–31d and six capacitors 31e–31j. A control signal output terminal of the transconductance amplifier tuning circuitry 30 is connected to control terminals of the respective transconductance amplifiers 31a–31d in the Gm-C filter 31.

The tuning circuitry 30 and the Gm-C filter 31 are fabricated on the same LSI, and therefore variations in the gain or conductance Gm of each transconductance amplifier due to manufacturing and variations in the capacitance C of each capacitor due to manufacturing in the tuning circuitry 30 are substantially equal to these in the Gm-C filter 31.

Thus, if the gain of each transconductance amplifier in the Gm-C filter 31 is controlled by the control signal which is used for feedback control of the gain of each transconductance amplifier in the tuning circuitry 30, the variations in the gains and the capacitances due to manufacturing can be compensated so as to tune the ratio Gm/C of the conductance Gm and the capacitance C to a constant value. As a result, a desired filter characteristics can be expected irrespective of the variations due to manufacturing.

Hereinafter, configuration of this tuning circuitry 30 will be described in detail.

Figure 4:
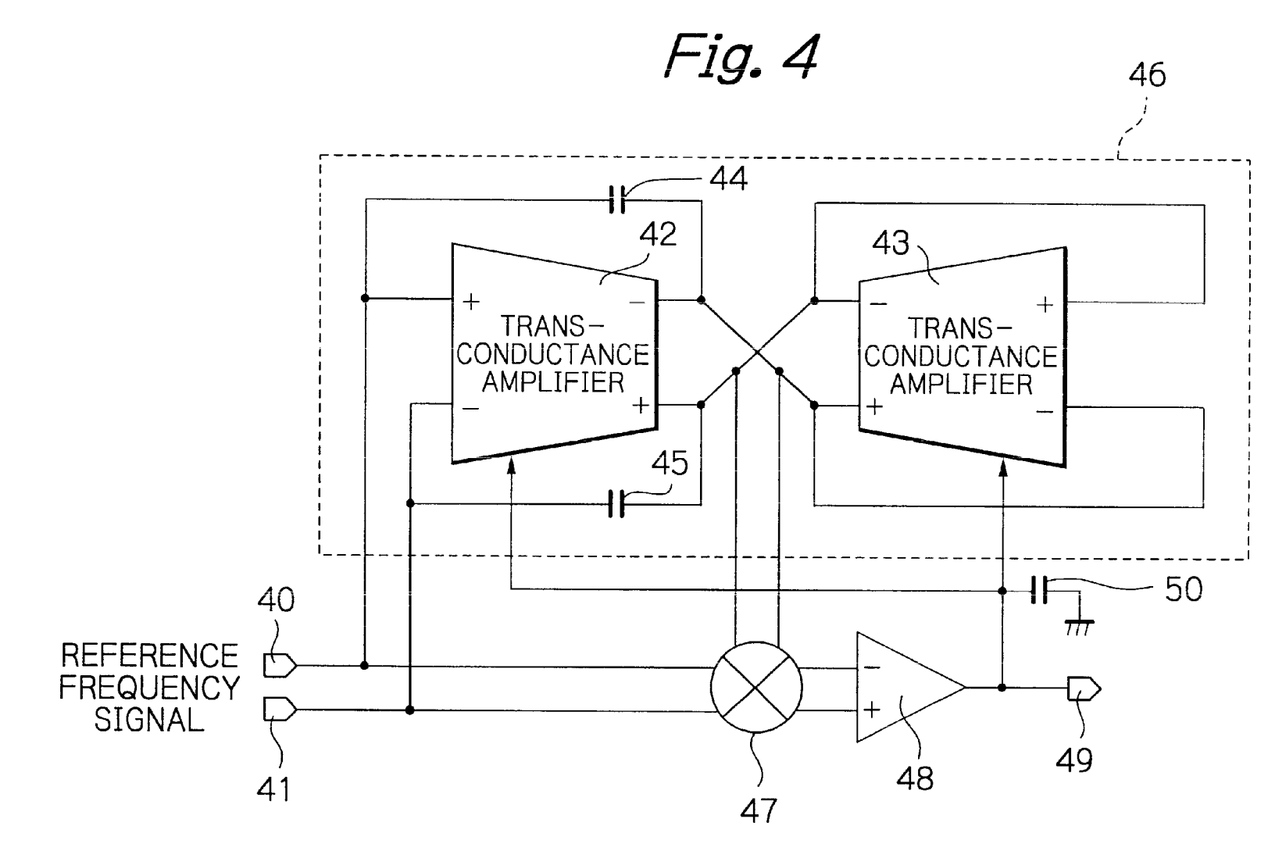
FIG. 4 shows a block diagram illustrating configuration of the transconductance amplifier tuning circuitry.
Figure 5:
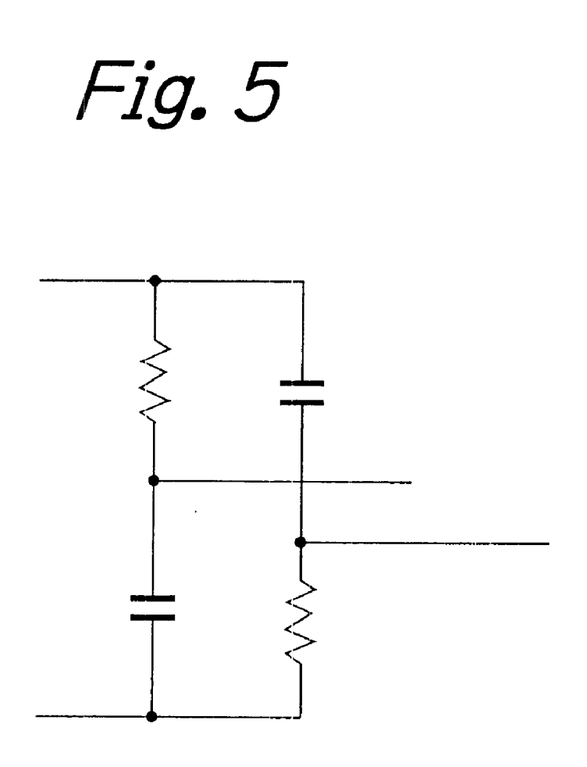
FIG. 5 shows an equivalent circuit of a RC phase-shifter section of the circuit in FIG. 4.

FIG. 4 illustrates configuration of the transconductance amplifier tuning circuitry, and FIG. 5 illustrates an equivalent circuit of a RC phase-shifter section of this tuning circuitry.

In FIG. 4, reference numerals 40 and 41 denote two input terminals to which external reference frequency signals are input, 42 and 43 two transconductance amplifiers with the aforementioned configuration, and 44 and 45 two capacitors, respectively. The circuitry 46 constituted by the transconductance amplifiers 42 and 43 and the capacitors 44 and 45 operates as an RC phase-shifter shown in FIG. 5.

Two output terminals of the RC phase-shifter 46 are connected to two input terminals of a mixer circuit or multiplier 47, respectively. The other two input terminals of this mixer circuit 47 are connected to the reference signal input terminals 40 and 41, respectively.

Two output terminals of the mixer circuit 47 are connected to differential input terminals of an operational amplifier 48, respectively. An output terminal of this operational amplifier 48 is connected to a control signal output terminal 49 and to control terminals of the transconductance amplifiers 42 and 43.

A smoothing capacitor 50 is connected between the control signal output terminal 49 and the ground.

In the RC phase-shifter 46, two input terminals of the transconductance amplifier 42 are connected to the reference signal input terminals 40 and 41, respectively. The one input terminal (+) of the amplifier 42 is coupled with one output terminal (−) of this amplifier 42 via the capacitor 44, and the other input terminal (−) of the amplifier 42 is coupled with the other output terminal (+) of this amplifier 42 via the capacitor 45. The other output terminal (+) of the amplifier 42 is directly connected to one output terminal (−) of the transconductance amplifier 43, and the one output terminal (−) of the amplifier 42 is directly connected to the other output terminal (+) of the amplifier 43. The one input terminal (+) of the amplifier 43 is directly connected to the one output terminal (−) of this amplifier 43, and the other input terminal (−) of the amplifier 43 is directly connected to the other output terminal (+) of this amplifier 43. The two output terminals of these amplifiers 42 and 43 are connected to the respective two input terminals of the mixer circuit 47 as the output terminals of the RC phase-shifter 46.

Input reference frequency signals are directly applied to the mixer circuit 47 and also applied to the RC phase-shifter 46. This RC phase-shifter 46 is inherently configured so as to shift the phase of the applied signal by 90 degrees when its RC time constant coincides with the frequency of the applied signal. Thus, normally the phase of the reference frequency signals will be shifted by 90 degrees in the phase-shifter 46, and the phase-shifted signals will be applied to the mixer circuit 47.

In the mixer circuit 47, both the applied signals are multiplied and the results are applied to the differential input terminals of the operational amplifier 48. If the phase difference between the phase-shifted signals and the reference frequency signals applied to the mixer circuit 47 is just 90 degrees, no DC level signal will be output from the operational amplifier 48. However, if there occurs variation in at least one of the gain or conductance Gm of the transconductance amplifiers 42 and/or 43 and the capacitance C of the capacitors 44 and/or 45 due to manufacturing problems, the phase-shifting amount of the RC phase-shifter 46 will differ from 90 degrees causing the phase difference between both the signals applied to the mixer circuit 47 to differ from 90 degrees. Thus, DC level signal will be output from the operational amplifier 48. This DC level signal is applied to the control terminals of the transconductance amplifiers 42 and 43 as a control signal for feedback controlling their gain so as to adjust the phase-shifting amount of the RC phase-shifter 46 to 90 degrees. This control signal is output from the control signal output terminal 49 to the Gm-C filter 31 to similarly control the gain of the transconductance amplifiers 31a–31d as well as the transconductance amplifiers 42 and 43. Thus, the variations in the gains and the capacitances in the Gm-C filter 31 due to manufacturing can be accurately compensated.

In this example, particularly, since the tuning circuitry 30 is configured by the RC phase-shifter 46 for shifting the input signal phase by 90 degrees, the mixer circuit 47 and the operational amplifier 48, required is only two transconductance amplifiers and two capacitors resulting smaller power consumption and smaller occupying area in a LSI chip.

It is apparent that configuration and the number of the Gm-C filter tuned by the tuning circuitry 30 are not limited to the aforementioned configurations but various modifications are possible.

Figure 6:
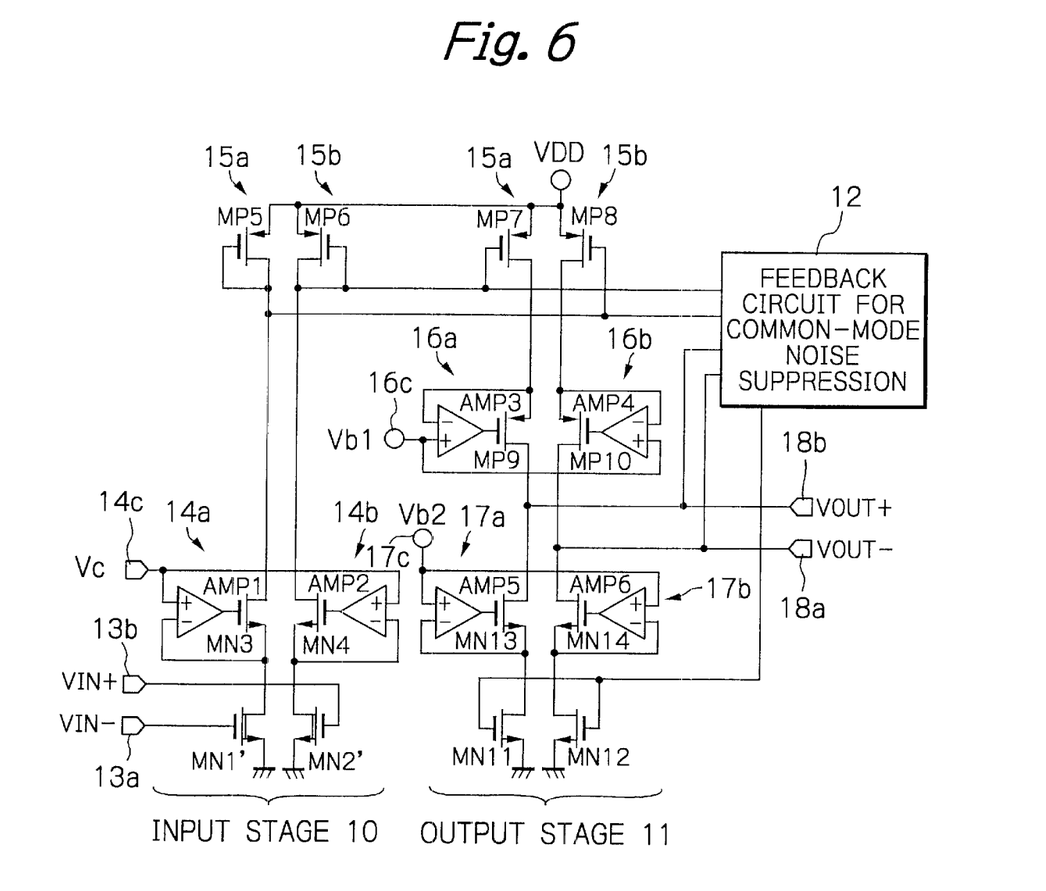
FIG. 6 shows a circuit diagram illustrating a transconductance amplifier in a second embodiment according to the present invention.

FIG. 6 illustrates a transconductance amplifier in a second embodiment according to the present invention.

This embodiment has the same configuration as that of the first embodiment shown in FIGS. 1 and 2 except that a pair of transistors MN1' and MN2' that configure the differential input circuit are depletion NMOS transistors. Thus, the same elements as those in the first embodiment are referred by the same numerals.

As mentioned before, in general, a DC voltage level of input/output signal is determined to a half of the source voltage (VDD/2). Therefore, suppose a dynamic range of input voltage signal is ±0.3 V, the threshold voltage Vth of a transistor in input circuit should be Vth<VDD/2−0.3 V in order to achieve linear voltage-current conversion. However, by using depletion transistors with a threshold voltage Vth less than zero volt as this embodiment, there occur no problem even if the source voltage of VDD=1 V is to be realized. The source voltage may be lowered in theory to about 0.6 V by using the depletion NMOS transistors MN1' and MN2' as this embodiment and if dynamic range of input voltage signal is ±0.3 V.

The other configuration, operations, advantages and modifications in this embodiment are the same as those in the first embodiment.

Figure 7:
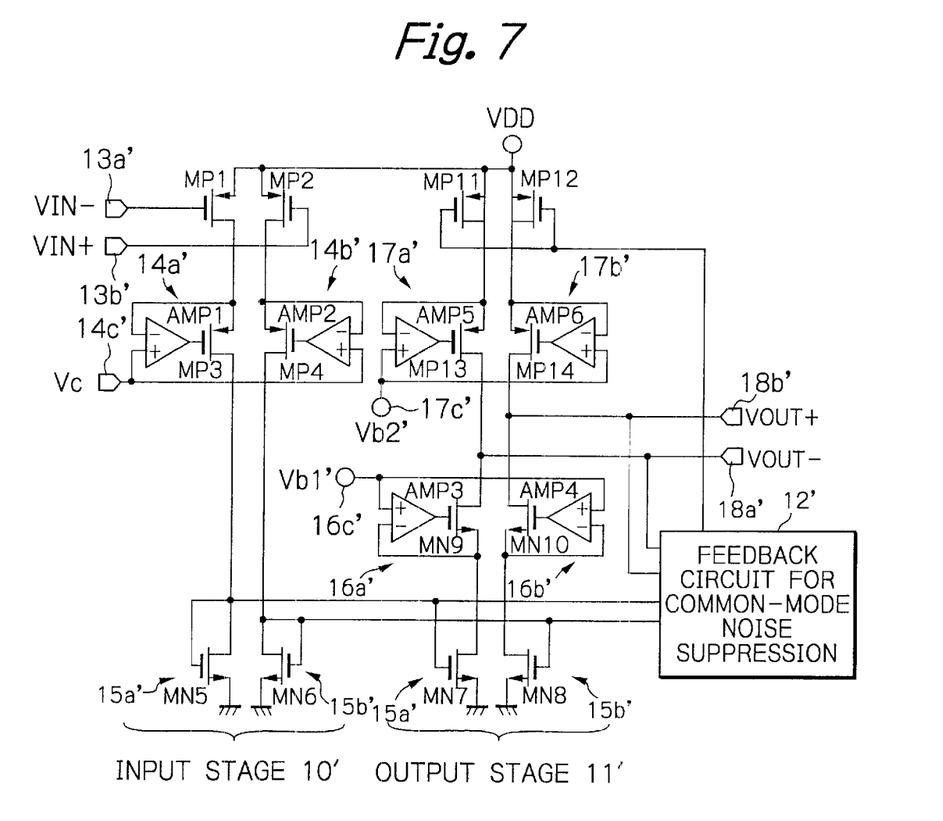
FIG. 7 shows a circuit diagram illustrating a transconductance amplifier in a third embodiment according to the present invention.

FIG. 7 illustrates a transconductance amplifier in a third embodiment according to the present invention.

This embodiment has the similar configuration as that of the first embodiment shown in FIGS. 1 and 2 except that the NMOS transistors MN1, MN2, MN3, MN4, MN11, MN12, MN13 and MN14 in the first embodiment are replaced by PMOS transistors MP1, MP2, MP3, MP4, MP11, MP12, MP13 and MP14, respectively, that PMOS transistors MP5, MP6, MP7, MP8, MP9 and MP10 in the first embodiment are replaced by NMOS transistors MN5, MN6, MN7, MN8, MN9 and MN10, respectively, and that the voltage source and the ground are interchanged with each other. Thus, the similar elements as those in the first embodiment are referred by attaching dash on the same numerals. A bias voltage Vb1' supplied to a bias terminal 16c' is determined to a value of about ¼ of the source voltage VDD or less. More concretely, in case that the source voltage VDD is 1 V, the bias voltage Vb1' may be set to about 0.25 V, more preferably to about 0.15 V. Also, a bias voltage Vb2' supplied to a bias terminal 17c' is determined to a value of about ¾ of the source voltage VDD or more. More concretely, in case that the source voltage VDD is 1 V, the bias voltage Vb2' may be set to about 0.75 V, more preferably to about 0.85 V.

The other configuration, operations, advantages and modifications in this embodiment are the same as those in the first embodiment.

Figure 8:
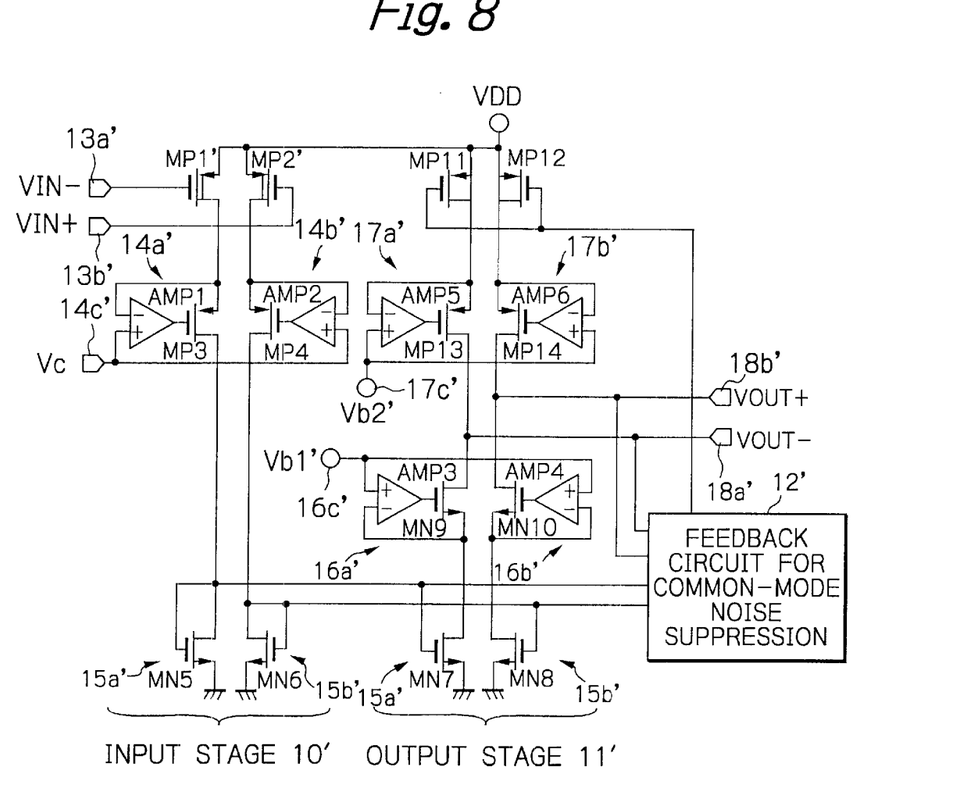
FIG. 8 shows a circuit diagram illustrating a transconductance amplifier in a fourth embodiment according to the present invention.

FIG. 8 illustrates a transconductance amplifier in a fourth embodiment according to the present invention.

This embodiment has the same configuration as that of the third embodiment shown in FIG. 7 except that a pair of transistors MP1' and MP2' that configure the differential input circuit are depletion PMOS transistors. Thus, the same elements as those in the third embodiment are referred by the same numerals.

As mentioned before, in general, a DC voltage level of input/output signal is determined to a half of the source voltage (VDD/2). Therefore, suppose a dynamic range of input voltage signal is ±0.3 V, the threshold voltage Vth of a transistor in input circuit should be Vth<VDD/2−0.3 V in order to achieve linear voltage-current conversion. However, by using depletion transistors with a threshold voltage Vth less than zero volt as this embodiment, there occur no problem even if the source voltage of VDD=1 V is to be realized. The source voltage may be lowered in theory to about 0.6 V by using the depletion PMOS transistors MP1' and MP2' as this embodiment and if dynamic range of input voltage signal is ±0.3 V.

The other configuration, operations, advantages and modifications in this embodiment are the same as those in the third embodiment.

It is apparent that any one of transconductance amplifier disclosed in the second to fourth embodiments may be used in the aforementioned transconductance amplifier tuning circuitry.

Many widely different embodiments of the present invention may be constructed without departing from the spirit and scope of the present invention. It should be understood that the present invention is not limited to the specific embodiments described in the specification, except as defined in the appended claims.

What is claimed is:

1. A transconductance amplifier including an input stage and an output stage, said input stage comprising:

a differential input circuit for converting a differential voltage signal applied thereto into a differential current signal;

a first pair of regulated cascode circuits for adjusting output voltages of said differential input circuit depending upon a control voltage applied thereto; and an input section of a pair of current mirror circuits for mirroring the differential current signal from said differential input circuit, said differential input circuit, said first pair of regulated cascode circuits, and said input section of the pair of current mirror circuits being connected in series with each other between a voltage source and a ground, said output stage comprising:
an output section of said pair of current mirror circuits;
a differential current source circuit;
a second pair of regulated cascode circuits for keeping output voltages of said current mirror circuit to a first bias voltage applied thereto;
a third pair of regulated cascode circuits for keeping output voltages of said differential current source circuit to a second bias voltage applied thereto, output terminals of said third pair of regulated cascode circuits being connected to output terminals of said second pair of regulated cascode circuits; and
a pair of amplifier output terminals connected to said output terminals of said second and third pairs of regulated cascode circuits,
said output section of the pair of current mirror circuits, said second and third pairs of regulated cascode circuits and said differential current source circuit being connected in series with each other between the voltage source and the ground.

2. The transconductance amplifier as claimed in claim 1, wherein said transconductance amplifier further comprises a feedback circuit for common-mode noise suppression, said feedback circuit controlling, depending upon common-mode noise applied to the transconductance amplifier, output voltages at said pair of amplifier output terminals to a predetermined voltage.

3. The transconductance amplifier as claimed in claim 2, wherein said differential current source circuit controls currents flowing through said second and third pairs of regulated cascode circuits depending upon a feedback signal provided from said feedback circuit.

4. The transconductance amplifier as claimed in claim 1, wherein said differential input circuit consists of two enhancement MOS transistors with a low threshold voltage, for receiving the differential voltage signal applied thereto, respectively.

5. The transconductance amplifier as claimed in claim 4, wherein said low threshold voltage of said enhancement MOS transistors is less than 0.2 V.

6. The transconductance amplifier as claimed in claim 1, wherein said differential input circuit consists of two depletion MOS transistors for receiving the differential voltage signal applied thereto, respectively.

7. The transconductance amplifier as claimed in claim 1, wherein said differential input circuit consists of first and second transistors with gates connected respectively to first and second amplifier input terminals and with sources connected together to the ground or the voltage source.

8. The transconductance amplifier as claimed in claim 1, wherein each pair of said first, second and third pairs of regulated cascode circuits consist of an operational amplifier and a transistor with a gate connected to an output terminal of said operational amplifier.

9. The transconductance amplifier as claimed in claim 1, wherein said first pair of regulated cascode circuits consist of third and fourth transistors with sources connected respectively to output terminals of said differential input circuit, a first operational amplifier with a non-inverting input terminal connected to a control terminal which receives the control voltage for controlling a conductance Gm, with an inverting input terminal connected to a source of said third transistor and with an output terminal connected to a gate of said third transistor, and a second operational amplifier with a non-inverting input terminal connected to said control terminal, with an inverting input terminal connected to a source of said fourth transistor and with an output terminal connected to a gate of said fourth transistor.

10. The transconductance amplifier as claimed in claim 1, wherein said second pair of regulated cascode circuits consist of ninth and tenth transistors with sources connected respectively to output terminals of said current mirror circuit, a third operational amplifier with a non-inverting input terminal connected to a first bias terminal, with an inverting input terminal connected to a source of said ninth transistor and with an output terminal connected to a gate of said ninth transistor, and a fourth operational amplifier with a non-inverting input terminal connected to said first bias terminal, with an inverting input terminal connected to a source of said tenth transistor and with an output terminal connected to a gate of said tenth transistor.

11. The transconductance amplifier as claimed in claim 1, wherein said third pair of regulated cascode circuits consist of thirteenth and fourteenth transistors with sources connected respectively to output terminals of said differential current source circuit, a fifth operational amplifier with a non-inverting input terminal connected to a second bias terminal, with an inverting input terminal connected to a source of said thirteenth transistor and with an output terminal connected to a gate of said thirteenth transistor, and a sixth operational amplifier with a non-inverting input terminal connected to said second bias terminal, with an inverting input terminal connected to a source of said fourteenth transistor and with an output terminal connected to a gate of said fourteenth transistor.

12. The transconductance amplifier as claimed in claim 1, wherein said first bias voltage is set to a voltage of about ¾ of a source voltage or more, and said second bias voltage is set to a voltage of about ¼ of the source voltage or less.

13. The transconductance amplifier as claimed in claim 1, wherein said first bias voltage is set to a voltage of about ¼ of the source voltage or less, and said second bias voltage is set to a voltage of about ¾ of a source voltage or more.

14. A filter provided with a plurality of transconductance amplifiers, each of said transconductance amplifiers including an input stage and an output stage,
said input stage comprising:
a differential input circuit for converting a differential voltage signal applied thereto into a differential current signal;
a first pair of regulated cascode circuits for adjusting output voltages of said differential input circuit depending upon a control voltage applied thereto; and
an input section of a pair of current mirror circuits for mirroring the differential current signal from said differential input circuit,
said differential input circuit, said first pair of regulated cascode circuits, and said input section of the pair of current mirror circuits being connected in series with each other between a voltage source and a ground,
said output stage comprising:
an output section of said pair of current mirror circuits;
a differential current source circuit;
a second pair of regulated cascode circuits for keeping output voltages of said current mirror circuit to a first bias voltage applied thereto;
a third pair of regulated cascode circuits for keeping output voltages of said differential current source circuit to a second bias voltage applied thereto, output terminals of said third pair of regulated cascode circuits being connected to output terminals of said second pair of regulated cascode circuits; and
a pair of amplifier output terminals connected to said output terminals of said second and third pairs of regulated cascode circuits, said output section of the pair of current mirror circuits, said second and third pairs of regulated cascode circuits and said differential current source circuit being connected in series with each other between the voltage source and the ground.

15. A transconductance amplifier tuning circuitry including two reference signal input terminals to which reference frequency signals are input, an RC phase-shifter connected to said two reference signal input terminals and provided with two transconductance amplifiers and two capacitors, a multiplier with input terminals connected to two output terminals of said RC phase-shifter and to said two reference signal input terminals, and an operational amplifier with two differential input terminals connected to two output terminals of said multiplier and with an output terminal connected to control terminals of said transconductance amplifiers, said tuning circuitry feedback-controlling gains of said two transconductance amplifiers so that said RC phase-shifter always shifts a phase of the input reference frequency signals by 90 degrees, each of said two transconductance amplifiers including an input stage and an output stage, said input stage comprising:
    a differential input circuit for converting a differential voltage signal applied thereto into a differential current signal;
    a first pair of regulated cascode circuits for adjusting output voltages of said differential input circuit depending upon a control voltage applied thereto; and
    an input section of a pair of current mirror circuits for mirroring the differential current signal from said differential input circuit, said differential input circuit, said first pair of regulated cascode circuits, and said input section of the pair of current mirror circuits being connected in series with each other between a voltage source and a ground, said output stage comprising:
    an output section of said pair of current mirror circuits;
    a differential current source circuit;
    a second pair of regulated cascode circuits for keeping output voltages of said current mirror circuit to a first bias voltage applied thereto;
    a third pair of regulated cascode circuits for keeping output voltages of said differential current source circuit to a second bias voltage applied thereto, output terminals of said third pair of regulated cascode circuits being connected to output terminals of said second pair of regulated cascode circuits; and
    a pair of amplifier output terminals connected to said output terminals of said second and third pairs of regulated cascode circuits, said output section of the pair of current mirror circuits, said second and third pairs of regulated cascode circuits and said differential current source circuit being connected in series with each other between the voltage source and the ground.

16. The tuning circuitry as claimed in claim 15, wherein said RC phase-shifter comprises a first transconductance amplifier with first and second input terminals connected to said two reference signal input terminals, a first capacitor connected between said first input terminal of said first transconductance amplifier and a first output terminal of said first transconductance amplifier, a second capacitor connected between said second input terminal of said first transconductance amplifier and a second output terminal of said first transconductance amplifier, and a second transconductance amplifier with a first output terminal connected to said second output terminal of said first transconductance amplifier and with a second output terminal connected to said first output terminal of said first transconductance amplifier, a first input terminal of said second transconductance amplifier being connected to said first output terminal of said second transconductance amplifier and a second input terminal of said second transconductance amplifier being connected to said second output terminal of said second transconductance amplifier.

17. The tuning circuitry as claimed in claim 16, wherein said multiplier is a mixer circuit with first two input terminals connected to said two reference signal input terminals and with second two input terminals connected to said first and second output terminals of said first transconductance amplifier.

18. The tuning circuitry as claimed in claim 15, wherein said circuitry further includes a control signal output terminal connected to said output terminal of said operational amplifier, for outputting the control signal outside.

19. The tuning circuitry as claimed in claim 18, wherein said circuitry further includes a third capacitor for smoothing, connected between said control signal output terminal and the ground.

20. A transconductance amplifier comprising:
    first and second transistors with gates connected respectively to first and second amplifier input terminals to which a differential voltage is input and with sources connected together to a first voltage source;
    third and fourth transistors with sources connected respectively to drains of said first and second transistors;
    a first operational amplifier with a non-inverting input terminal connected to a control terminal which receives a signal for controlling a conductance Gm, with an inverting input terminal connected to a source of said third transistor and with an output terminal connected to a gate of said third transistor;
    a second operational amplifier with a non-inverting input terminal connected to said control terminal, with an inverting input terminal connected to a source of said fourth transistor and with an output terminal connected to a gate of said fourth transistor;
    fifth and sixth transistors with sources connected together to a second voltage source and with drains and gates connected respectively to drains of said third and fourth transistors;
    seventh and eighth transistors with sources connected together to the second voltage source and with gates connected respectively to the drains and gates of said fifth and sixth transistors;
    ninth and tenth transistors with sources connected respectively to drains of said seventh and eighth transistors;
    a third operational amplifier with a non-inverting input terminal connected to a first bias terminal, with an inverting input terminal connected to a source of said ninth transistor and with an output terminal connected to a gate of said ninth transistor;
    a fourth operational amplifier with a non-inverting input terminal connected to said first bias terminal, with an inverting input terminal connected to a source of said tenth transistor and with an output terminal connected to a gate of said tenth transistor;
    eleventh and twelfth transistors with sources connected together to the first voltage source;

thirteenth and fourteenth transistors with drains connected respectively to drains of said ninth and tenth transistors and with sources connected respectively to drains of said eleventh and twelfth transistors;

a fifth operational amplifier with a non-inverting input terminal connected to a second bias terminal, with an inverting input terminal connected to a source of said thirteenth transistor and with an output terminal connected to a gate of said thirteenth transistor;

a sixth operational amplifier with a non-inverting input terminal connected to said second bias terminal, with an inverting input terminal connected to a source of said fourteenth transistor and with an output terminal connected to a gate of said fourteenth transistor; and first and second amplifier output terminals connected to the drains of said ninth and thirteenth transistors and the drains of said tenth and fourteenth transistors, respectively.

21. The transconductance amplifier as claimed in claim 20, wherein said transconductance amplifier further comprises a feedback circuit for common-mode noise suppression, said feedback circuit including input terminals connected to the drains of said fifth and sixth transistors and to said first and second amplifier output terminals, and an output terminal connected to gates of said eleventh and twelfth transistors for providing a common-mode noise canceling signal when signals at its input terminals change due to a common-mode noise occurrence.

22. The transconductance amplifier as claimed in claim 21, wherein said feedback circuit comprises:

fifteenth and sixteenth transistors with gates connected together to the drain and gate of said sixth transistor and with sources connected together to the second voltage source;

seventeenth and eighteenth transistors with gates connected together to the drain and gate of said fifth transistor and with sources connected together to the second voltage source;

a nineteenth transistor with a gate connected to said first amplifier output terminal and with a source connected together to drains of said fifteenth and seventeenth transistors;

a twentieth transistor with a gate connected to said second amplifier output terminal and with a source connected together to drains of said sixteenth and eighteenth transistors;

a twenty-first transistor with a gate connected to a third bias terminal and with a source connected together to the drains of said fifteenth and seventeenth transistors;

a twenty-second transistor with a gate connected to said third bias terminal and with a source connected together to the drains of said sixteenth and eighteenth transistors;

a twenty-third transistor with a source connected to said first voltage source and with gate and drain connected together to drains of said nineteenth and twentieth transistors; and a twenty-fourth transistor with a source connected to said first voltage source and with gate and drain connected together to drains of said twenty-first and twenty-second transistors and to gates of said eleventh and twelfth transistors.

23. The transconductance amplifier as claimed in claim 20, wherein said first voltage source is a ground and said second voltage source is a positive voltage source, wherein said first, second, third, fourth, eleventh, twelfth, thirteenth and fourteenth transistors are NMOS transistors, and wherein said fifth, sixth, seventh, eighth, ninth and tenth transistors are PMOS transistors.

24. The transconductance amplifier as claimed in claim 20, wherein said first voltage source is a positive voltage source and said second voltage source is a ground, wherein said first, second, third, fourth, eleventh, twelfth, thirteenth and fourteenth transistors are PMOS transistors, and wherein said fifth, sixth, seventh, eighth, ninth and tenth transistors are NMOS transistors.

25. The transconductance amplifier as claimed in claim 20, wherein said first and second transistors are enhancement MOS transistors with an absolute threshold voltage less than 0.2 V.

26. The transconductance amplifier as claimed in claim 20, wherein said first and second transistors are depletion MOS transistors.

27. A filter provided with a plurality of transconductance amplifiers, each of said transconductance amplifiers comprising:

first and second transistors with gates connected respectively to first and second amplifier input terminals to which a differential voltage is input and with sources connected together to a first voltage source;

third and fourth transistors with sources connected respectively to drains of said first and second transistors;

a first operational amplifier with a non-inverting input terminal connected to a control terminal which receives a signal for controlling a conductance Gm, with an inverting input terminal connected to a source of said third transistor and with an output terminal connected to a gate of said third transistor;

a second operational amplifier with a non-inverting input terminal connected to said control terminal, with an inverting input terminal connected to a source of said fourth transistor and with an output terminal connected to a gate of said fourth transistor;

fifth and sixth transistors with sources connected together to a second voltage source and with drains and gates connected respectively to drains of said third and fourth transistors;

seventh and eighth transistors with sources connected together to the second voltage source and with gates connected respectively to the drains and gates of said fifth and sixth transistors;

ninth and tenth transistors with sources connected respectively to drains of said seventh and eighth transistors;

a third operational amplifier with a non-inverting input terminal connected to a first bias terminal, with an inverting input terminal connected to a source of said ninth transistor and with an output terminal connected to a gate of said ninth transistor;

a fourth operational amplifier with a non-inverting input terminal connected to said first bias terminal, with an inverting input terminal connected to a source of said tenth transistor and with an output terminal connected to a gate of said tenth transistor;

eleventh and twelfth transistors with sources connected together to the first voltage source;

thirteenth and fourteenth transistors with drains connected respectively to drains of said ninth and tenth transistors and with sources connected respectively to drains of said eleventh and twelfth transistors;

a fifth operational amplifier with a non-inverting input terminal connected to a second bias terminal, with an inverting input terminal connected to a source of said thirteenth transistor and with an output terminal connected to a gate of said thirteenth transistor;

a sixth operational amplifier with a non-inverting input terminal connected to said second bias terminal, with an inverting input terminal connected to a source of said fourteenth transistor and with an output terminal connected to a gate of said fourteenth transistor; and first and second amplifier output terminals connected to the drains of said ninth and thirteenth transistors and the drains of said tenth and fourteenth transistors, respectively.

28. A transconductance amplifier tuning circuitry including first and second reference signal input terminals for receiving reference frequency signals, a control signal output terminal for outputting a control signal, first and second transconductance amplifiers, first and second capacitors, a mixer circuit and an operational amplifier, said first and second reference signal input terminals being connected to first and second input terminals of said first transconductance amplifier, said first input terminal of said first transconductance amplifier and a first output terminal of said first transconductance amplifier being connected via said first capacitor, said second input terminal of said first transconductance amplifier and a second output terminal of said first transconductance amplifier being connected via said second capacitor, said second output terminal of said first transconductance amplifier being connected to a first output terminal of said second transconductance amplifier, said first output terminal of said first transconductance amplifier being connected to a second output terminal of said second transconductance amplifier, a first input terminal of said second transconductance amplifier being connected to said first output terminal of said second transconductance amplifier, a second input terminal of said second transconductance amplifier being connected to said second output terminal of said second transconductance amplifier, first two input terminals of said mixer circuit being connected to said first and second reference signal input terminals, second two input terminals of said mixer circuit being connected to said first and second output terminals of said first transconductance amplifier, two output terminals of said mixer circuit being connected respectively to two differential input terminals of said operational amplifier, an output terminal of said operational amplifier being connected to control terminals of said first and second transconductance amplifiers and to said control signal output terminal, an RC phase-shifter being configured by said first and second transconductance amplifiers and said first and second capacitors, said mixer circuit and said operational amplifier to form a feedback loop for controlling gains of said first and second transconductance amplifiers so that said RC phase-shifter always shifts a phase of the input reference frequency signals by 90 degrees, each of said first and second transconductance amplifiers comprising:

first and second transistors with gates connected respectively to first and second amplifier input terminals to which a differential voltage is input and with sources connected together to a first voltage source;

third and fourth transistors with sources connected respectively to drains of said first and second transistors;

a first operational amplifier with a non-inverting input terminal connected to a control terminal which receives a signal for controlling a conductance Gm, with an inverting input terminal connected to a source of said third transistor and with an output terminal connected to a gate of said third transistor;

a second operational amplifier with a non-inverting input terminal connected to said control terminal, with an inverting input terminal connected to a source of said fourth transistor and with an output terminal connected to a gate of said fourth transistor;

fifth and sixth transistors with sources connected together to a second voltage source and with drains and gates connected respectively to drains of said third and fourth transistors;

seventh and eighth transistors with sources connected together to the second voltage source and with gates connected respectively to the drains and gates of said fifth and sixth transistors;

ninth and tenth transistors with sources connected respectively to drains of said seventh and eighth transistors;

a third operational amplifier with a non-inverting input terminal connected to a first bias terminal, with an inverting input terminal connected to a source of said ninth transistor and with an output terminal connected to a gate of said ninth transistor;

a fourth operational amplifier with a non-inverting input terminal connected to said first bias terminal, with an inverting input terminal connected to a source of said tenth transistor and with an output terminal connected to a gate of said tenth transistor;

eleventh and twelfth transistors with sources connected together to the first voltage source;

thirteenth and fourteenth transistors with drains connected respectively to drains of said ninth and tenth transistors and with sources connected respectively to drains of said eleventh and twelfth transistors;

a fifth operational amplifier with a non-inverting input terminal connected to a second bias terminal, with an inverting input terminal connected to a source of said thirteenth transistor and with an output terminal connected to a gate of said thirteenth transistor;

a sixth operational amplifier with a non-inverting input terminal connected to said second bias terminal, with an inverting input terminal connected to a source of said fourteenth transistor and with an output terminal connected to a gate of said fourteenth transistor; and first and second amplifier output terminals connected to the drains of said ninth and thirteenth transistors and the drains of said tenth and fourteenth transistors, respectively.

29. The tuning circuitry as claimed in claim 28, wherein said circuitry further includes a third capacitor for smoothing, connected between said control signal output terminal and a ground.

* * * * *